US008542517B2

(12) United States Patent
Li

(10) Patent No.: US 8,542,517 B2
(45) Date of Patent: Sep. 24, 2013

(54) LOW VOLTAGE PROGRAMMABLE MOSFET ANTIFUSE WITH BODY CONTACT FOR DIFFUSION HEATING

(75) Inventor: Yan Zun Li, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 13/158,510

(22) Filed: Jun. 13, 2011

(65) Prior Publication Data

US 2012/0314475 A1 Dec. 13, 2012

(51) Int. Cl.
*G11C 17/00* (2006.01)
(52) U.S. Cl.
USPC ............. 365/104; 365/105; 257/50; 257/530; 257/E23.147
(58) Field of Classification Search
USPC ............ 365/104, 105; 257/50, 530, E23.147
See application file for complete search history.

(56) References Cited

U.S. PATENT DOCUMENTS

| | | | |
|---|---|---|---|
| 5,298,784 A | 3/1994 | Gambino et al. | |
| 5,774,011 A | 6/1998 | Au et al. | |
| 6,031,275 A | 2/2000 | Kalnitsky et al. | |
| 6,580,145 B2 * | 6/2003 | Wu et al. | 257/530 |
| 6,815,264 B2 | 11/2004 | Stribley et al. | |
| 6,913,954 B2 | 7/2005 | Kothandaraman | |
| 7,179,700 B2 * | 2/2007 | Adetutu et al. | 438/199 |
| 7,205,612 B2 * | 4/2007 | Cai et al. | 257/355 |
| 8,350,264 B2 * | 1/2013 | Li et al. | 257/50 |
| 2007/0099326 A1 | 5/2007 | Hsu et al. | |
| 2009/0102014 A1 | 4/2009 | Borot et al. | |
| 2010/0187638 A1 | 7/2010 | Borot et al. | |

FOREIGN PATENT DOCUMENTS

WO   WO 9729515   8/1997

OTHER PUBLICATIONS

U.S. Appl. No. 12/835,764, filed Jul. 14, 2010. This application is owned in common with the present application.

* cited by examiner

*Primary Examiner* — Connie Yoha
(74) *Attorney, Agent, or Firm* — Cantor Colburn LLP; Katherine Brown

(57) ABSTRACT

An antifuse can include an insulated gate field effect transistor ("IGFET") having an active semiconductor region including a body and first regions, i.e., at least one source region and at least one drain region separated from one another by the body. A gate may overlie the body and a body contact is electrically connected with the body. The first regions have opposite conductivity (i.e., n-type or p-type) from the body. The IGFET can be configured such that a programming current through at least one of the first regions and the body contact causes heating sufficient to drive dopant diffusion from the at least one first region into the body and cause an edge of the at least one first region to move closer to an adjacent edge of at least one other of the first regions. In such way, the programming current can permanently reduce electrical resistance by one or more orders of magnitude between the at least one first region and the at least one other first region.

18 Claims, 8 Drawing Sheets

PFET

NFET

LOW VOLTAGE PROGRAMMABLE MOSFET ANTIFUSE WITH BODY CONTACT FOR DIFFUSION HEATING

BACKGROUND OF THE INVENTION

1. Field of the Invention

The subject matter of the present application relates to electrical antifuses, especially such devices provided in integrated circuit chips.

2. Description of the Related Art

Integrated circuit chips often include elements which can be permanently altered after manufacture in order to make certain changes to circuits therein, or to maintain states or data on the chip. For example, an integrated circuit chip can include electrically operable fuses or an array of fuses to store critical information on chip, to conduct redundancy repair to improve manufacturing yield, or to fine tune circuit performance through local circuit trimming, among other purposes. Such fuses initially begin as conductive elements, i.e., devices which are closed circuit in that initially, they are electrically connected between external terminals. A fuse can be programmed, i.e., blown, to make it much less conductive, i.e., open circuited in that it effectively is no longer electrically connected between external terminals. Electrical antifuses are alternative structures which can be provided on an integrated circuit. Such antifuses typically begin as elements which are essentially nonconductive, having high electrical resistance (i.e., open circuit state). Programming an antifuse greatly reduces the electrical resistance of the antifuse to a level at which the antifuse is electrically connected between external terminals, achieving in effect a closed circuit state.

One challenge faced by electrical fuses and antifuses used in integrated circuit chips is the ability to reliably program the fuse or antifuse. During programming, an electrical fuse may require a metal fuse link to melt under high current, which can cause local explosion with metal particles scattered far away from the blown fuse or stress cracks to form in adjacent dielectric materials and affect nearby circuits. In some existing electrical antifuses, a high voltage is applied across a thin dielectric layer to create a localized breakdown that is electrically conductive. These types of fuses and antifuses can sometimes fail to change completely to a programmed state, such that a fuse can remain relatively conductive even after programming, and an antifuse may remain too resistive after programming. In some cases, only 90-99% of these devices work properly when programmed. Another challenge for many of the fuse or antifuse solutions today which utilize such destructive mechanisms is the ability to maintain the programmed state of the fuse or antifuse throughout its useful life time. In aggravated application environments such as high temperature, some programmed fuses and antifuses may gradually change back into their previous unprogrammed states.

Moreover, fuses and antifuses may require special high voltage levels not available on the integrated circuit chip for programming them. This can pose design challenges for supplying the voltage levels on the chip and contributes to the overall cost of making the chip.

SUMMARY OF THE INVENTION

An antifuse according to an embodiment of the invention can include an insulated gate field effect transistor ("IGFET"). An active semiconductor region of the IGFET includes a body, and first regions being at least one source region and at least one drain region separated from one another by the body. A gate may overlie the body and a body contact is electrically connected with the body. The first regions have a first conductivity type being one of n-type or p-type, and the body has a second conductivity type being one of n-type or p-type and opposite the first conductivity type. In such embodiment, the IGFET is configured such that a programming current through at least one of the first regions and the body contact causes heating within the body which is sufficient to drive dopant diffusion from the at least one first region into the body, and cause an edge of the at least one first region to move closer to an adjacent edge of at least one other of the first regions, thus permanently reducing electrical resistance between the at least one first region and the at least one other first region by one or more orders of magnitude.

In one example of such embodiment, the at least one first region may include at least one source region and at least one drain region of the antifuse, and the IGFET is configured such that programming currents through the source region to the body contact and through the drain region to the body contact cause heating within the body sufficient to drive dopant diffusion from each of the source region and drain region into the body and cause edges of each of the source region and the drain region to move closer to one another.

In a particular example of such embodiment, the body may include at least two branch body portions which are separated from one another by at least one of the first regions and a connecting body portion that connects the at least two branch body portions. The gate of the IGFET in such embodiment may have corresponding gate portions overlying respective ones of the branch and connecting body portions. In such example, the at least one source region may include first and second source regions separated from one another by the connecting body portion and the at least one drain region may include first and second drain regions separated from one another by the connecting body portion.

In a particular example, the at least one source region can include first and second source regions separated from one another by the branch body portions and the at least one drain region is disposed between at least two of the branch body portions.

In a particular example, the IGFET can be configured such that the programming current can be applied by applying a voltage between the at least one first region and the body which is less than twice a nominal maximum voltage between the at least one first region and the gate usable to operate the IGFET in an on-state.

In a particular example, the IGFET can be configured such that the programming current can be applied by applying a programming voltage between the at least one first region and the body which is approximately equal to a nominal maximum voltage between the at least one first region and the gate usable to operate the IGFET in an on-state.

In a particular example, the antifuse can be configured such that application of the programming current to the antifuse causes the edge of the at least one first region to move sufficiently to overlap the adjacent edge of the at least one other first region.

In a particular example, the antifuse can be configured such that when the antifuse is in an unprogrammed state a resistance between the at least one source region and the at least one drain region is higher than 100,000 ohms and when the antifuse is in a programmed state the resistance between the at least one source region and the at least one drain region is lower than 10,000 ohms.

In a particular example, the antifuse can be configured such that application of the programming current to the antifuse causes the resistance between the at least one source region and the at least one drain region to decrease by three or more orders of magnitude.

In a particular example, the antifuse can be configured such that application of the programming current to the antifuse causes heating within the body sufficient to move the edge of the first semiconductor region sufficiently to produce the one or more order of magnitude reduction in resistance without melting either the silicide region or the semiconductor material of the body.

In a particular example, the antifuse can be configured such that while in an unprogrammed state, the at least one source region and the at least one drain region are separated by a distance comparable to a width of the gate in a direction between the at least one source region and the at least one drain region.

In a particular example, the antifuse can be configured such that application of the programming current to the antifuse causes at least a portion of the body to reach a temperature greater than 700° C.

In a particular example, the antifuse can be configured such that application of the programming current to the antifuse for a duration of less than 50 milliseconds causes at least a portion of the body to reach a temperature of greater than 700° C. and to cause the edge of the at least one first region to move sufficiently to produce the one or more order of magnitude reduction in resistance.

In a particular example, the body and the first regions of the antifuse can be disposed in an active semiconductor device layer of a silicon-on-insulator ("SOI") substrate, the SOI substrate including a bulk semiconductor layer and a buried dielectric layer separating the active semiconductor device layer from the bulk semiconductor layer.

In a particular example, the body and the first regions of the antifuse can be disposed in an active semiconductor device layer of a substrate overlying a bulk semiconductor layer of the substrate, the active semiconductor device layer including a stressed semiconductor alloy of silicon with a second semiconductor material, the stressed semiconductor alloy and the bulk semiconductor layer containing first and second different weight percentages of the second semiconductor material, respectively.

Another embodiment of the invention provides a method programming an antifuse. Such embodiment can include driving a programming current between at least one of a plurality of first regions of an insulated gate field effect transistor ("IGFET") and a body contact connected to a body of the IGFET. The first regions of the antifuse include at least one source region and at least one drain region. The body of the antifuse has a portion disposed between the at least one source region and the at least one drain region, in which the body and the plurality of first regions have first and second opposite conductivities selected from n-type and p-type conductivities. In such way, the programming current can cause heating within the body sufficient to drive dopant diffusion from the at least one first region into the body such that an edge of the at least one first region moves closer to an adjacent edge of at least one other of the first regions, thus permanently reducing an electrical resistance between the at least one first region and the at least one other first region by one or more orders of magnitude.

In an example according to such method, the first regions may have a source region and a drain region, and the programming current can be driven between the source region and the body contact and between the drain region and the body contact to cause heating within the body sufficient to drive dopant diffusion from each of the source region and the drain region into the body and cause edges of each of the source region and the drain region to move closer to one another.

In an example according to such method, the step of driving the programming current can cause the body to reach a temperature greater than 700° C.

In an example according to such method, the step of driving the programming current can be performed for a duration of less than 1000 milliseconds and can cause the body to reach a temperature greater than 700° C.

DETAILED DESCRIPTION

Figure 1:
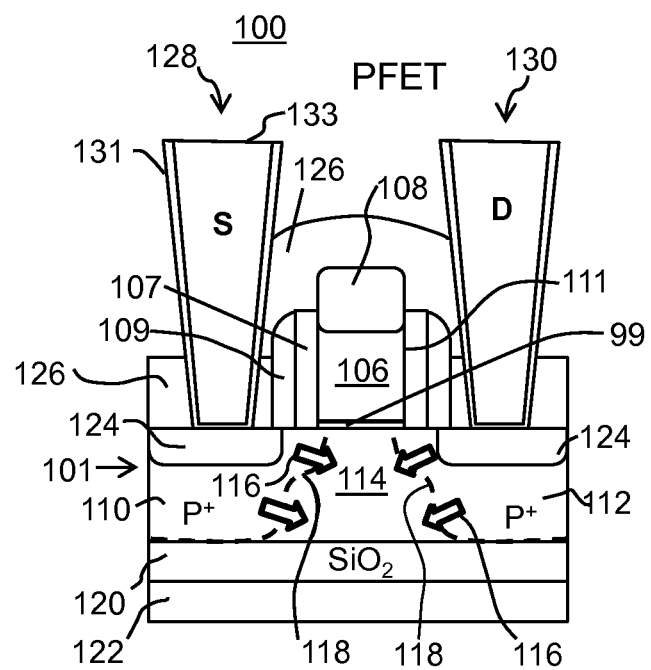
FIG. 1 is a sectional view illustrating a PFET type antifuse according to an embodiment of the invention.
Figure 2:
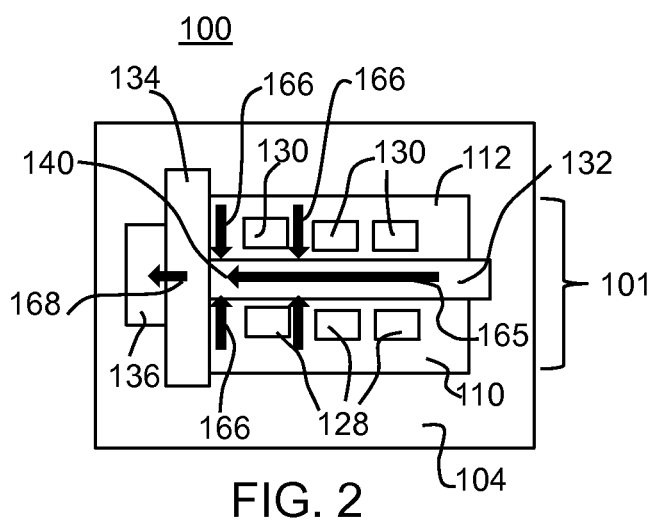
FIG. 2 is a top plan view illustrating the PFET type antifuse in an example according to the embodiment of FIG. 1.

FIGS. 1 and 2 are a plan view and a corresponding sectional view, respectively, of an antifuse 100 in accordance with an embodiment of the invention. As seen therein, antifuse 100 in the unprogrammed state can have a structure similar to that of an insulated gate field effect transistor ("IGFET") having a p-type conductivity channel, such as may be embodied in a semiconductor chip having an integrated circuit therein. The IGFET may have a gate 106 which consists essentially of semiconductor material, or which consists essentially of metal, or which includes a combination of at least one of a semiconductor material, a metal, or a conductive compound of a metal. In one example, a silicide region 108 may be disposed at an upper portion of the gate 106 and may form part of the gate. The gate 106 is separated from a body 114 of the IGFET by a gate dielectric 99. All such IGFETs can be referred to generally as metal oxide semiconductor field effect transistors ("MOSFETs"), whether or not the gate includes a metal layer and whether or not the gate dielectric 99 is an oxide as opposed to other gate dielectric materials which incorporate a nitride or other dielectric material, such as a material with a higher dielectric constant (e.g., hafnium oxides, hafnium silicates or other "high-K" dielectric materials such as ferroelectric dielectric materials, among others). As seen in FIG. 1, pairs of dielectric spacers 107, 109 may overlie walls 111 of the gate 106.

As further seen in FIG. 2, the gate can have a first portion 132 and a second portion 134 each overlying the body of the IGFET within an active semiconductor region 101. The first portion 132 may separate the source region 110 from the drain region 112, while the second portion 134 may separate the source and drain regions from a body contact region 136 which is also a part of the active semiconductor region.

The active semiconductor region 101 typically is a unitary single-crystal region of semiconductor material such as silicon, although the semiconductor material can be another material such as an alloy of silicon with another semiconductor, or a III-V or II-VI compound semiconductor material, for example. In one example, the body can be electrically isolated from other active semiconductor regions (not shown) of the same semiconductor chip by a region 104 of dielectric material which may surround the area of the active semiconductor region. In a particular example, the region 104 of dielectric material can be a trench isolation region which can include an oxide of silicon, for example.

In the embodiment depicted in FIGS. 1-2, the active semiconductor region 101 can be provided in a silicon-on-insulator ("SOI") substrate which further includes a buried dielectric or buried oxide ("BOX") layer 120 which separates the active semiconductor region 101 from a bulk semiconductor region 122 of the substrate. The active semiconductor region has regions of adjoining semiconductor material. First regions within the active semiconductor region include a source region 110 and a drain region 112. The body 114 adjoins and separates the first regions, i.e., the source and drain regions from one another. Each of the first regions has a first conductivity type or "conductivity" being one of p-type or n-type (e.g., p-type doped diffusion regions as shown in FIG. 1), and the body 114 has a second conductivity type or "conductivity" (e.g., an n-type conductivity well) which is opposite the first conductivity. In the example of FIGS. 1-2, the first regions have p-type conductivity and are heavily doped, e.g., having a dopant concentration greater than about $10^{18}$ cm$^{-3}$, such that their dopant concentrations can be referred to as "p+". In one example, when the semiconductor region consists essentially of silicon, the p-type dopant can be boron. The conductivity of the body 114 in this example is n-type; in this case, an n-well 114 can be the body. The n-well is less heavily doped than the p+ doped region. In one example, the dopant concentration of the n-well can be in a range of $10^{14}$ cm$^{-3}$ to $10^{19}$ cm$^{-3}$ but in any case must be less heavily doped than the adjoining p+ regions.

The antifuse may further include silicide regions 124 in contact with the source region 110 and drain region 112. A dielectric region 126 which may or may not include a dielectric stressor layer, such as may be made of silicon nitride, can overlie the silicide regions 108, 124. As further shown in FIG. 1, conductive vias 128, 130 can extend downwardly through the dielectric region 126 to contact the silicide regions 124 that overlie the source and drain regions, respectively. In the example shown in FIG. 1, the conductive vias 128, 130 have a composite structure which includes two or more layers of conductive material such as a barrier layer 131 adjacent the silicide regions and a second conductive material layer 133 such as a metal overlying the barrier layer.

Referring to the PFET type antifuse depicted in FIGS. 1 and 2, during programming, circuitry (not shown) connected with the antifuse 100 can apply a positive programming voltage between at least one conductive via 128 and the body 114 of the antifuse while simultaneously applying a positive programming voltage between at least one conductive via 130 and the body 114. Typically, a plurality of conductive vias 128 electrically contact the source region 110 and a plurality of conductive vias 130 electrically contact the drain region 112 as shown in FIGS. 1-2.

The applied programming voltage causes a current to flow through these conductive vias 128, 130 into the source region 110 and drain region 112, respectively, and then into the body 114. The programming current eventually exits the antifuse through the body contact 136. The programming current causes heating within the body of the antifuse, which may cause the body to reach a temperature of above 700° C. The heat generated during programming is sufficient to cause dopant to diffuse outward from the more heavily doped p-type source and drain regions 110, 112 into the less heavily n-type doped body 114. The heating-induced dopant diffusion from the source and drain regions causes adjacent edges 118 of the source and drain regions to move even closer to one another in directions shown by arrows 116. After programming, edges 118 of the source and drain regions 110, 112 are substantially closer to one another than before programming.

The antifuse can be programmed using relative low voltages that are close to the voltages used for operating MOSFETs on the same semiconductor chip which have similar device structures, except that other MOSFETS may not need a body contact 136 having characteristics as in the antifuse 100 depicted in FIGS. 1-2. Thus, while operating voltages applied to the source and drain regions of other similar MOSFETs on the chip may range from ground to a maximum of 0.9 to 1.6 volts, in one example, the voltage applied to the source and drain regions during programming may range from 1.5 to 2.5 volts. Thus, in one example, a programming voltage can be applied between the source region 110 and the body 114, and between the drain region 112 and the body 114, in which the programming voltage is approximately equal to the nominal maximum voltage that can be applied between the source region 110 and the gate 106 of the IGFET in order to operate the IGFET in an on-state. In another example, a programming voltage can be applied to the antifuse in the same way but in which the programming voltage can be less than twice the nominal maximum voltage that can be applied between the source region and the gate of the IGFET in order to operate the IGFET in an on-state.

A key condition required to program the antifuse is to establish a path for substantial current to flow through the antifuse between the source region contact 128 and the body contact 136 and between the drain region contact 130 and the body contact 136. Thus, in the PFET embodiment of FIGS. 1-2, during programming the body contact 136 can be held at a voltage which forward biases the p-n junction between the source region and the body, and forward biases the p-n junction between the drain region and the body such that current flowing into the source and drain regions 110, 112 through contacts 128, 130 flows into the body 114 and then out through the body contact 136. Typically, the body contact 136 of the PFET antifuse 100 (FIGS. 1-2) can be tied to ground when programming the antifuse. However, the body contact 136 could instead be tied to a different voltage so long as the programming condition generates the programming current from the source and drain regions to the body contact.

During programming, a voltage may be applied to the gate 106 of the antifuse. In one example, when a gate dielectric of the antifuse is relatively thin, such voltage can help protect the gate dielectric from an excessively high electric field during programming which could damage a gate dielectric 99 which is relatively thin. In this case, during programming a voltage can be applied to the gate at about half the programming voltage applied to the source and drain regions. In this case, the gate voltage Vg=½ Vprog. However, when the gate dielectric of the antifuse is not so thin, no protection may be required, and a voltage can be applied to the gate which ranges from ground to the maximum voltage normally applied to the gate. Thus, in this second case, the gate voltage Vg may range from 0 volts to 2.5 volts.

Programming the antifuse only requires that the antifuse reliably reach a temperature at which the required dopant diffusion occurs. The temperature, of course, is a function of the energy imparted to a portion of the body of the antifuse. As indicated above, the portion of the body that is heated to a temperature sufficient for the required dopant diffusion to occur need not encompass the entire area of the body. For a given antifuse structure, the primary variables determining the energy are the programming voltages and time. In one example, the programming voltages can be applied to the antifuse for a duration of less than one thousand milliseconds to program the antifuse. In a particular example, the programming voltages may be applied to the antifuse for a duration of less than 50 milliseconds to program the antifuse.

Figure 3:
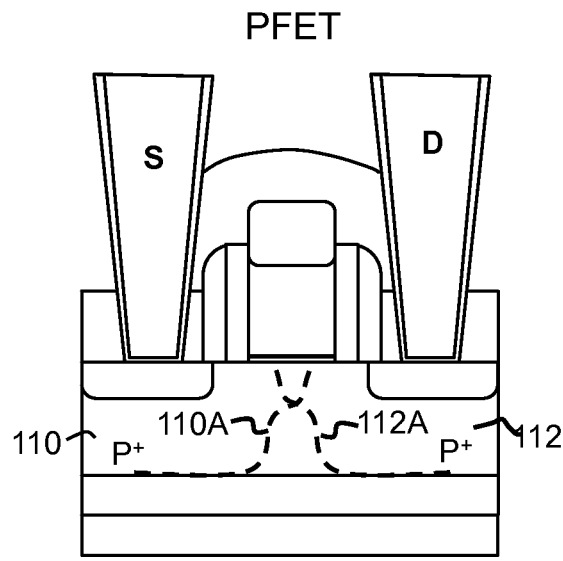
FIG. 3 is a sectional view illustrating a PFET type antifuse according to an embodiment of the invention in a particular example in which adjacent edges of the source and drain regions overlap after the antifuse is programmed.

In a particular example, as seen in FIG. 3, the diffusion of the p-type dopant during programming may be sufficient to cause the edges 110A, 112A of the p-type doped source and drain regions 110, 112 to meet, or even overlap one another. In such case, the body 114 will no longer fully separate the source and drain regions from one other and a p-type doped conduction path will then permanently connect the source and drain regions at least one location within the active semiconductor region of the antifuse. Referring again to FIG. 2, the current during programming may be highest in a particular area 140 of the active semiconductor region underlying the gate 132 and adjacent to the second portion of the gate. The direction of positive current within the antifuse 100 is illustrated by arrows 165, 166 and 168, in which arrows 165 and 168 indicate a direction of current flow within the body of the antifuse towards the body contact 136 and arrows 166 indicate the direction of current from the source and drain regions 110, 112 into the body. Due to the current, heating within the active semiconductor region can be highest in this area 140, and movement of the edges of the source and drain regions is expected to be greatest in area 140. After programming, of all the body 114 that lies between the source and drain regions 110, 112, area 140 can be expected to exhibit the least electrical resistance therebetween. Thus, temperatures reached within the relatively small area 140 of the active semiconductor region during programming can determine the final electrical resistance of the antifuse after programming.

Figure 4:
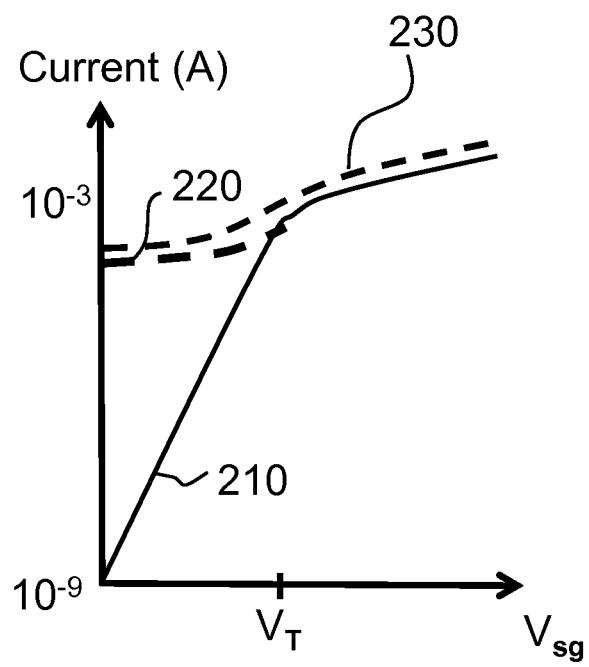
FIG. 4 is a graph showing a current versus voltage characteristic for an antifuse according to the embodiment of FIGS. 1-2 for both unprogrammed and programmed states.

FIG. 4 illustrates a current-voltage characteristic of the antifuse in both the initial unprogrammed state and the final programmed state. Initially, in an unprogrammed state as seen at curve 210 in FIG. 4, the current-voltage characteristic resembles that of an ordinary IGFET in which when the source to gate voltage or "$V_{sg}$" is below the threshold voltage $V_T$ of the IGFET, the current conducted between the source and drain regions is very low, and may be at nanoampere ($10^{-9}$ ampere) levels when $V_{sg}$ is around zero volts. Conversely, as seen at curve 220 in FIG. 4, once the antifuse has been programmed, the amount of current conducted between the source and drain regions 110, 112 of the antifuse may exceed that of the initially unprogrammed antifuse by one or more orders of magnitude. In the example shown at 220 in FIG. 4, after programming, the antifuse may conduct an amount of current that changes little with increases in $V_{sg}$, even at levels well below the initial threshold voltage $V_T$. In another example, after programming, the antifuse may be capable of conducting increased current 230 which exceeds that of the initial unprogrammed antifuse in any or all modes of transistor operation relative to the initial current-voltage characteristic curve 210. In some cases, it is possible to attain even greater differences in the amount of current conducted by the antifuse before and after programming. In a particular example, when $V_{sg}$ is zero volts, the amount of current 220 conducted by the antifuse before programming may be around $10^{-12}$ (not shown) ampere, which compares to a current of approximately $10^{-4}$ ampere after the antifuse has been programmed, a difference of about eight orders of magnitude.

Figure 5:
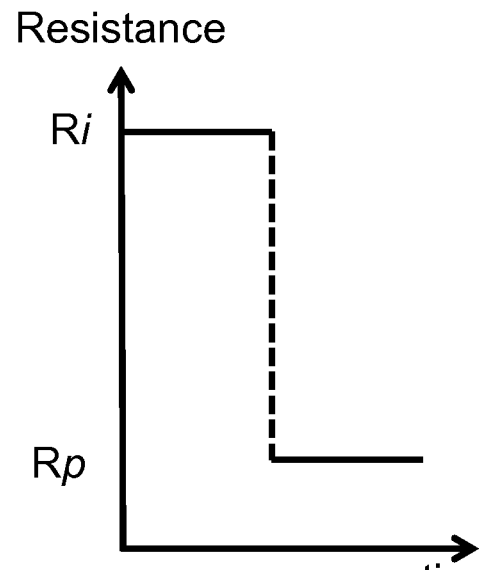
FIG. 5 is a graph showing a resistance of an antifuse according to an embodiment of the invention in an initial unprogrammed state and in a programmed state.

FIG. 5 further illustrates that the initial resistance of the antifuse between the source and drain regions, i.e., the resistance of the antifuse before programming (Ri) undergoes a step decrease to an after programming resistance value (Rp). From the above description regarding the amount of current conducted by the antifuse, it follows that the resistance between the source and drain regions of the antifuse before and after programming decreases by one or more orders of magnitude for any or all biasing voltages applied to source and drain regions of the antifuse when $V_{sg}$ is held at zero volts. Of course, per the above discussion of FIG. 4, when the step increase in the current is several orders of magnitude, a corresponding decrease in the resistance of the antifuse by several orders of magnitude will occur. Thus, in one example, when $V_{sg}$ is held at zero volts and any or all biasing voltages are applied to source and drain regions of the antifuse a decrease in the resistance by three or more orders of magnitude or an even greater decrease can occur due to programming the antifuse. This step change in the resistance of the antifuse can be detected, for example, by circuitry which applies the same biasing conditions to the source region, drain region and gate of the antifuse device under test that are applied to a representative sample device, and outputs a result based on which device has the greater resistance. Thus, when the circuit detects the antifuse as more resistive than the sample device such circuit outputs a result indicating the antifuse is "not programmed" or "unprogrammed". Conversely, when the circuit detects the antifuse as less resistive than the sample device such circuit outputs a result indicating the antifuse is "programmed". Such comparison can be used to detect even relatively modest changes in the resistance of the antifuse under test. Such comparison is also a robust technique, because conditions such as variations in power, voltage or temperature which can affect the resistance of the device under test tend also to affect the resistance of the representative sample device in the same way. Although the particular pre- and post-programming resistance of the antifuse are not limited to any particular values or ranges of values except for the reduction in resistance by one or more orders of magnitude, in a particular example, the resistance between the source and drain regions of the antifuse in the unprogrammed state can be greater than 100,000 ohms, and the resistance of the antifuse in the programmed state can be less than 10,000 ohms.

A resistance comparison technique yields a strong binary signal when the pre-programming resistance value of the antifuse is consistently greater than the sample device resistance and the post-programming resistance value of the antifuse is consistently lower than the sample device resistance. The antifuse device embodiments herein help achieve this goal because, unlike conventional antifuse structures described as background herein, the change in the present device structures due to programming is a change in the doped diffusion regions thereof that is consistent, predictable and not subject to subsequent degradation over time.

In the above example, the same voltage is applied simultaneously to the source region and the drain region when programming the antifuse. In a variation of the above-described embodiment, during programming a positive programming voltage can be applied only between the source region 110 and the body 114 of the antifuse through contacts 128, 136 connected thereto, while the voltage on the drain region can be allowed to float or can be set to a different voltage. In another variation, a positive programming voltage may be applied only between the drain region 112 and the body 114 of the antifuse through contacts 130, 136 connected thereto, while the voltage on the source region can be allowed to float or can be set to a different voltage.

Figure 6:
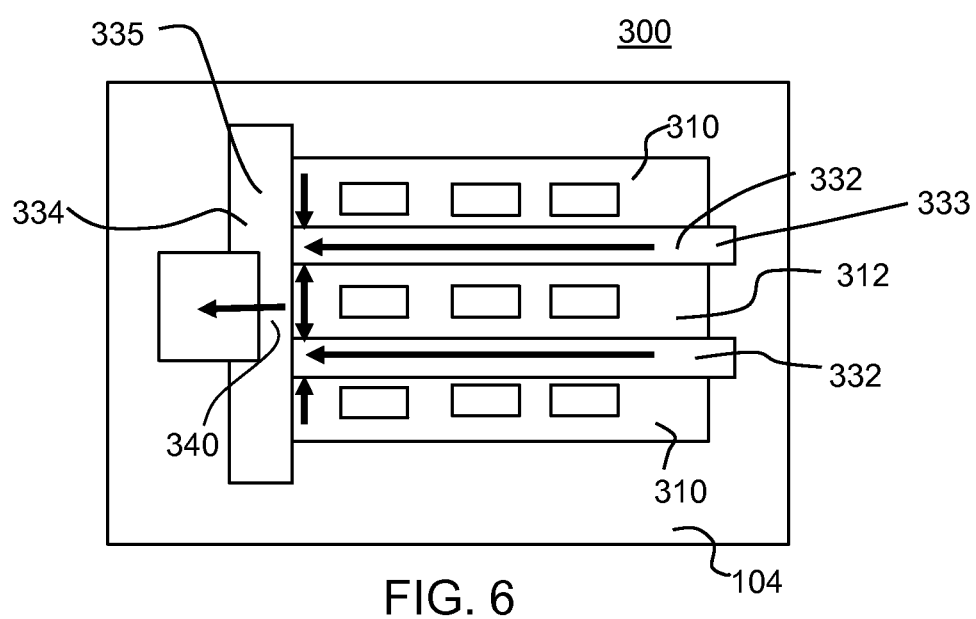
FIG. 6 is a top plan view illustrating a PFET type antifuse according to a variation of the embodiment shown in FIG. 1.

FIG. 6 illustrates an antifuse according to a variation of the above-described embodiment (FIGS. 1-2) in which the structure of the gate is different, and hence the body has different structure. Referring to FIG. 6, the body has a connecting portion 334 which corresponds to a connecting portion of the gate overlying the same, except that the gate can extend onto the surrounding isolation region 104, whereas the body ends where the isolation region 104 begins at the dashed lines 335. The body also has branch portions 332 corresponding to branch portions of the gate overlying the same, except again that the body ends at dashed lines 333 indicating the edges of the isolation region 104. In this case, the antifuse may have at least two source regions 310 separated from one another by branch portions 332 and may have at least one drain region 312 disposed between the two branch portions 332.

Areas of greatest heating within the antifuse 300 are expected to correspond to the areas of greatest current flow into the body, at location 340 within a middle portion of the body underlying gate 334. The arrows in FIG. 6 indicate directions of the current. The antifuse structure of FIG. 6 may make it possible to achieve a desirable heating profile within the antifuse body in a desirable amount of time.

Figure 7:
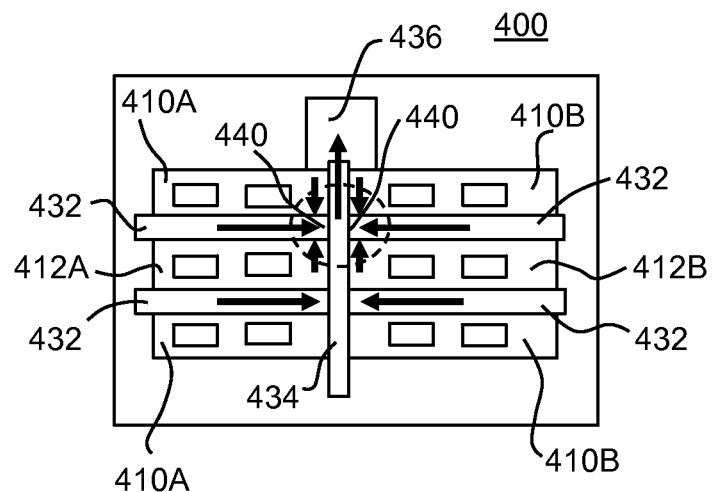
FIG. 7 is a top plan view illustrating a PFET type antifuse according to a variation of the embodiment shown in FIG. 1.

FIG. 7 illustrates yet another variation in which the antifuse 400 in which some source regions 410A are separated from other source regions 410B by the connecting portion 434 of the antifuse body. Likewise, some drain regions 412A are separated from other drain regions 412B by the connecting portion 434 of the antifuse body. Current flow towards the body contact 436 is indicated by the arrows in the FIG. 7. Areas of greatest current and therefore, greatest heating are expected to occur at areas 440 where the branch portions 432 meet the connecting portion 434 of the body.

Figure 8:
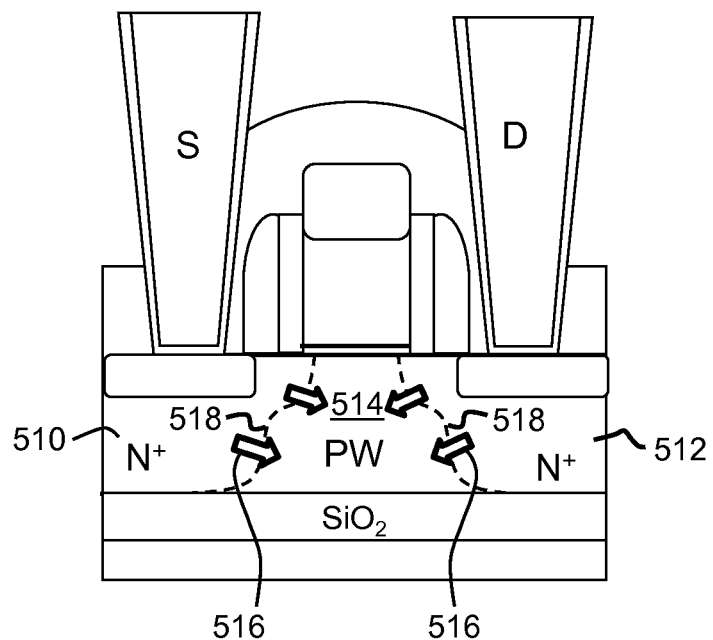
FIG. 8 is a sectional view illustrating an NFET type antifuse according to a variation of the embodiment shown in FIG. 1.

FIG. 8 illustrates an antifuse 500 having a structure similar to the PFET antifuse 100 described above relative to FIGS. 1-2, except that in this variation, the antifuse incorporates an n-channel type field effect transistor ("NFET"). In this case, the NFET antifuse has a p-well region 514 having p-type conductivity which can have a dopant concentration between about $10^{14}$ cm$^{-3}$ and $10^{19}$ cm$^{-3}$. The source and drain regions 510, 512 of the NFET, which are separated from one another by the p-well, can be heavily doped (n+), such as having an n-type dopant concentration greater than $10^{18}$ cm$^{-3}$. In any case, the dopant concentration in the source and drain regions is greater than the dopant concentration within the p-well region 514.

Figure 9:
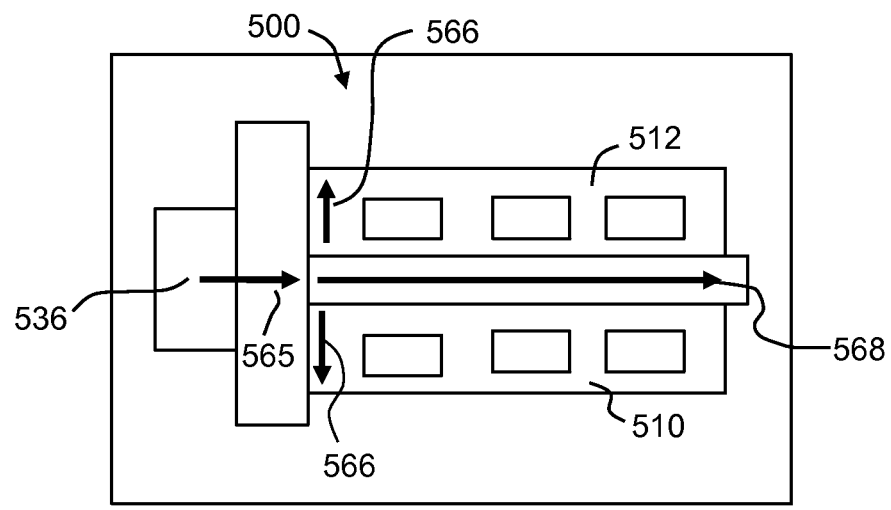
FIG. 9 is a top plan view illustrating an NFET type antifuse according to a variation of the embodiment shown in FIG. 2.

FIG. 9 is a corresponding plan view of NFET antifuse 500 according to one possible implementation. To program the NFET antifuse, a higher voltage must be applied to the body contact 536 than to the source and drain regions 510, 512 such that a positive programming current flows in the direction of arrows 565, 566 and 568 in FIG. 9 through the body contact 536 into the body of the NFET and then to the source and drain regions 510, 512. Referring again to FIG. 8, the programming current produces localized heating within the antifuse 500 which causes adjacent edges 518 of the source and drain regions 510, 512 to move closer to each other in the direction of arrows 516. After programming, the edges 518 have moved substantially closer to one another, and in some cases may overlap as in the example seen above in FIG. 3. A current-voltage transfer characteristic of the NFET antifuse can be as seen in FIG. 4, except that in the NFET antifuse, the current varies in relation to the gate to source voltage ("$V_{sg}$") of the NFET, rather than varying in relation to the source to gate voltage "$V_{sg}$" of a PFET as depicted in FIG. 4.

Figure 10:
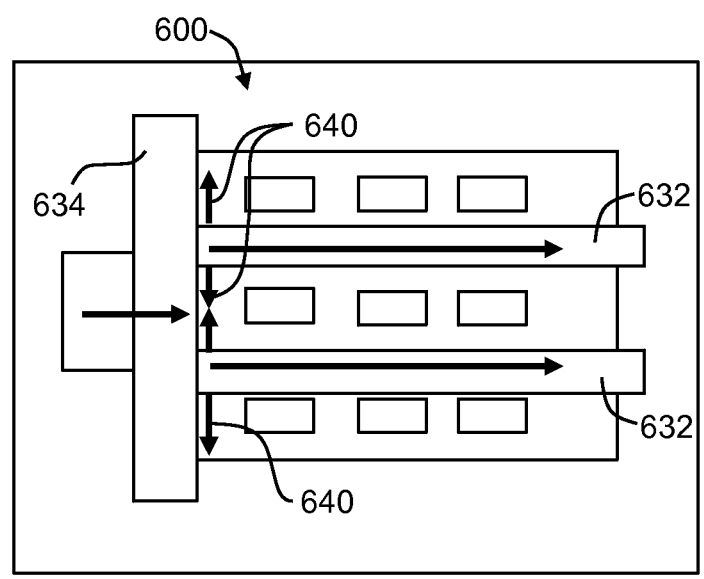
FIG. 10 is a top plan view illustrating an NFET type antifuse according to a variation of the embodiment shown in FIG. 6.

FIG. 10 illustrates an NFET antifuse 600 according to a variation similar to the PFET antifuse 300 discussed above relative to FIG. 6. In this case, the body of the NFET antifuse 600 has a connecting portion 634 and branch portions 632 corresponding to a connecting portion of a gate which overlies the body, as well as to branch portions of the gate. Areas of greatest heating within the antifuse 600 are expected to correspond to the areas of greatest current flow through the body, as indicated by the vertically-oriented arrows 640 in FIG. 10.

Figure 11:
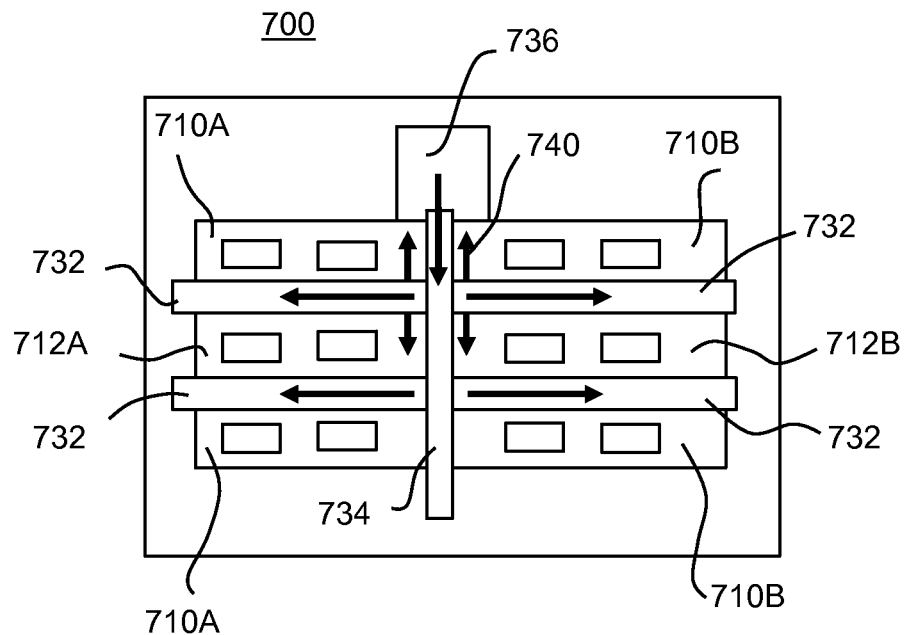
FIG. 11 is a top plan view illustrating an NFET type antifuse according to a variation of the embodiment shown in FIG. 7.

FIG. 11 illustrates an NFET antifuse 700 according to a variation similar to the PFET antifuse 400 discussed above relative to FIG. 7. In this case, some source regions 710A are separated from other source regions 710B by the connecting portion 734 of the antifuse body. Likewise, some drain regions 712A are separated from other drain regions 712B by the connecting portion 734 of the antifuse body. The direction of current flow from the body contact 736 is indicated by the arrows in the FIG. 11. Areas of greatest current in the NFET antifuse 700, and therefore, areas of greatest heating are expected to occur at areas 740 where the branch portions 732 meet the connecting portion 734 of the body. Movement of the adjacent edges of the source and drain regions is expected to be greatest in these areas 740. In accordance with an embodiment of the invention, the particular structure of the antifuse 700 and the conditions under which it is programmed can be engineered to attain a target reduction in the resistance in areas 740. In many cases, effects of the programming operation at other locations within the antifuse, being less significant, can be ignored since the reduction in resistance at areas 740 may determine the final after-programming resistance of the antifuse.

Figure 12:
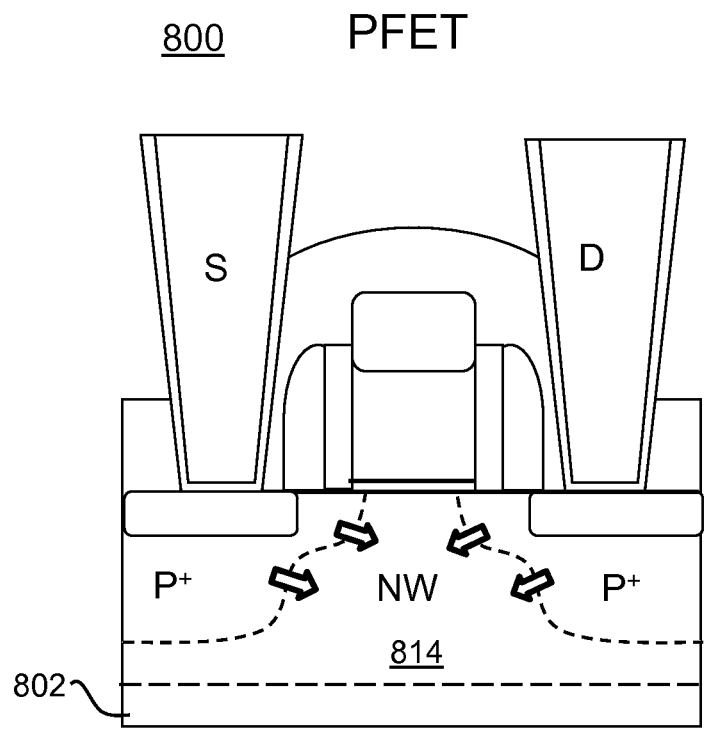
FIG. 12 is a sectional view illustrating a PFET type antifuse according to an embodiment of the invention, the antifuse being disposed in an active semiconductor region of a bulk semiconductor substrate.

FIG. 12 illustrates an antifuse 800 according to a variation of the PFET antifuse described above relative to FIG. 1. In this case, the buried dielectric region 120 of antifuse 100 (FIG. 1) is omitted. The n-well 814 typically overlies a p-type doped bulk layer 802 of a semiconductor substrate which can serve as a substrate ground for the PFET antifuse.

Figure 13:
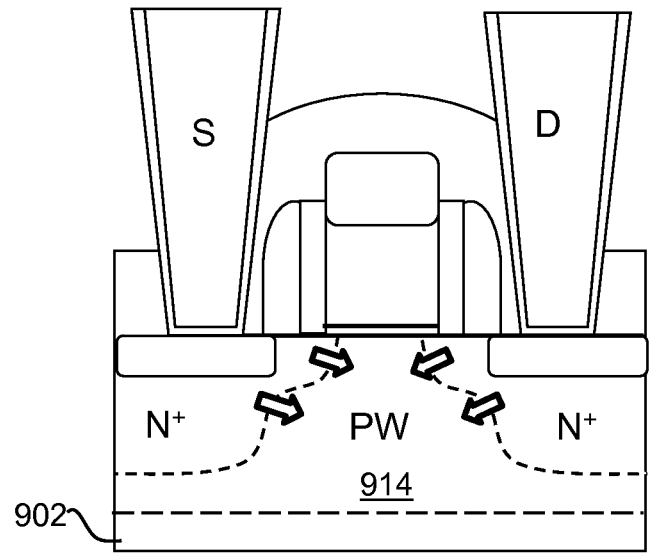
FIG. 13 is a sectional view illustrating an NFET type antifuse according to a variation of the embodiment shown in FIG. 12.

FIG. 13 illustrates an NFET antifuse 900 similar to the PFET antifuse 800 of FIG. 12. The p-well 914 of the antifuse 900 may have the same or a different conductivity type (n-type or p-type) as a p-type bulk semiconductor layer 902 of the substrate. In one embodiment, when the bulk semiconductor layer 902 is doped p-type, the p-well may be separated therefrom by an intervening n-well region. Otherwise, in another example, the p-well can be integral with the p-type bulk semiconductor layer 902.

Figure 14:
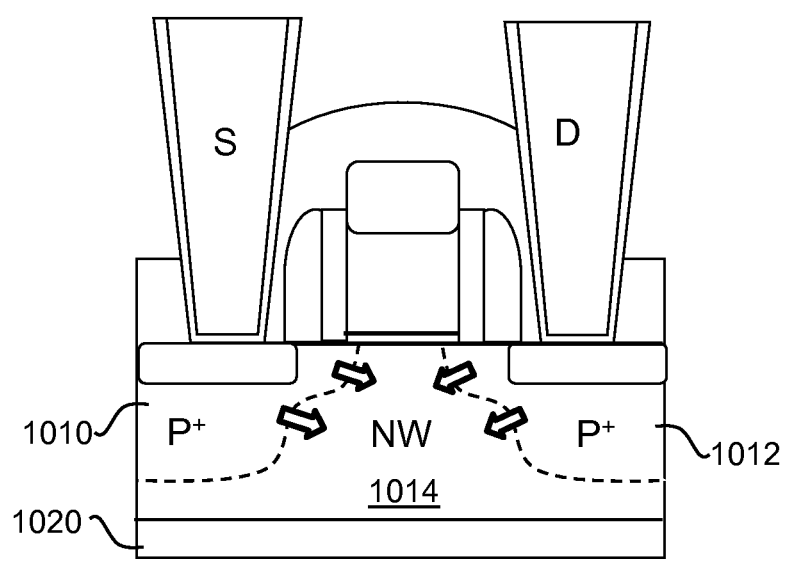
FIG. 14 is a sectional view illustrating a PFET type antifuse according to a variation of the embodiment shown in FIG. 8 in which at least the source region and the drain region are disposed in a semiconductor alloy region which may be used to enhance performance of the PFET.

FIG. 14 illustrates a PFET antifuse 1000 according to a further embodiment in which the p+ doped source and drain regions 1010, 1012 of the antifuse can consist essentially of a semiconductor alloy material such as silicon germanium. The n-well 1014 may or may not also consist essentially of the semiconductor alloy material. The semiconductor alloy material can assist in achieving a strain in the channel region of PFET devices (not shown) on the same substrate as the PFET antifuse 1000, such as for providing enhanced performance in such devices. In addition, SiGe has a much lower thermal conductivity, i.e., having a thermal conductivity of about 0.1 W/(cm·° C.) as compared to silicon which has a thermal conductivity of about 1.5 W/(cm·° C.), and therefore helps the antifuse programming by reducing the heat loss from the body where the heat is generated from the concentrated current. Region 1020 of the antifuse can be another semiconductor material such as silicon or in some cases can be a dielectric material.

Figure 15:
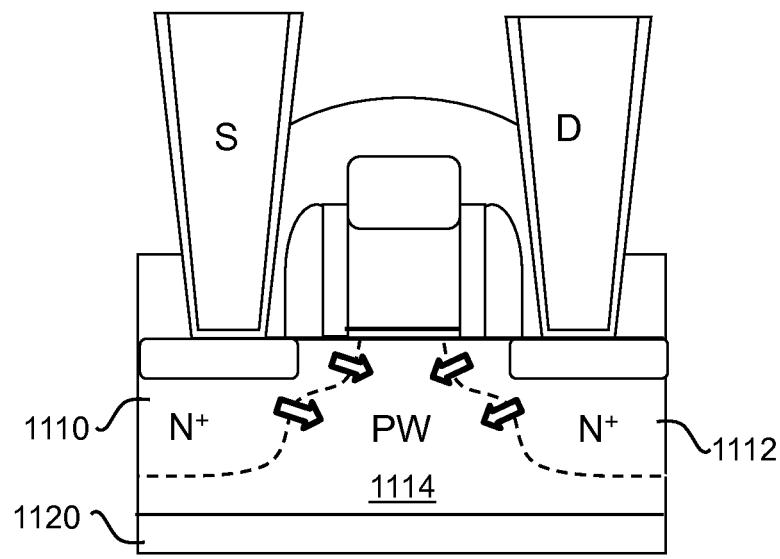
FIG. 15 is a sectional view illustrating an NFET type antifuse according to a variation of the embodiment shown in FIG. 14.

FIG. 15 illustrates an NFET antifuse 1100 similar to the PFET antifuse 1000 of FIG. 14 in which the which the n+ doped source and drain regions 1110, 1112 of the antifuse 1100 can consist essentially of a semiconductor alloy material such as silicon carbide. The p-well 1114 may or may not also consist essentially of the semiconductor alloy material. The semiconductor alloy material can assist in achieving a strain in the channel region of other NFET devices (not shown) on the same substrate as the NFET antifuse 1100, such as for providing enhanced performance in such NFET devices.

It will be appreciated that the various dependent claims and the features set forth therein can be combined in different ways than presented in the initial claims. It will also be appreciated that the features described in connection with individual embodiments may be shared with others of the described embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. An antifuse, comprising:
an insulated gate field effect transistor ("IGFET") having an active semiconductor region including a body, first regions being at least one source region and at least one drain region separated from one another by the body, a gate overlying the body, and a body contact electrically connected with the body, the first regions having a first connectivity type being on the n-type or p-type, and the body having a second conductivity type being one of n-type or p-type and being opposite the first conductivity type,
the IGFET being configured such that a programming current through at least one of the first regions and the body contact causes heating within the body sufficient to drive dopant diffusion from the at least one first region into the body such that an edge of the at least one first region moves closer to an adjacent edge of at least one other of the first regions, thus permanently reducing electrical resistance between the at least one first region and the at least one other first region by one or more orders of magnitude;
the IGFET also configured such that the programming current can be applied by applying a programming voltage between the at least one first region and the body which is approximately equal to a nominal maximum voltage between the at least one first region and the gate useable to operate the IGFET in an on-state; and
the antifuse is configured such that application of the programming current to the antifuse causes heating within the body sufficient to move the edge of the first semiconductor region sufficiently to produce the one or more order of magnitude reduction in resistance without melting either the silicide region or the semiconductor material of the body.

2. The antifuse of claim 1, wherein the at least one first region includes at least one source region and at least one drain region of the antifuse, and the IGFET is configured such that programming currents through the source region to the body contact and through the drain region to the body contact cause heating within the body sufficient to drive dopant diffusion from each of the source region and drain region into the body and cause edges of each of the source region and the drain region to move closer to one another.

3. The antifuse of claim 1, wherein the body includes at least two branch body portions separated from one another by at least one of the first regions and a connecting body portion connecting the at least two branch body portions, and the gate includes corresponding gate portions overlying respective ones of the branch and connecting body portions.

4. The antifuse of claim 3, wherein the at least one source region includes first and second source regions separated from one another by the connecting body portion and the at least one drain region includes first and second drain regions separated from one another by the connecting body portion.

5. The antifuse of claim 1, wherein the at least one source region includes first and second source regions separated from one another by the branch body portions and the at least one drain is disposed between at least two of the branch body portions.

6. The antifuse of claim 1, wherein the IGFET is configured such that the programming current can be applied by applying a voltage between the at least one first region and the body which is less than twice a nominal maximum voltage between the at least one first region and the gate usable to operate the IGFET in an on-state.

7. The antifuse of claim 1, wherein the antifuse is configured such that application of the programming current to the antifuse causes the edge of the at least one first region to move sufficiently to overlap the adjacent edge of the at least one other first region.

8. The antifuse of claim 1, being configured such that when the antifuse is in an unprogrammed state a resistance between the at least one source region and the at least one drain region is higher than 100,000 ohms and when the antifuse is in a programmed state the resistance between the at least one source region and the at least one drain region is lower than 10,000 ohms.

9. The antifuse of claim 1, wherein the antifuse is configured such that application of the programming current to the antifuse causes the resistance between the at least one source region and the at least one drain region to decrease by three or more orders of magnitude.

10. The antifuse of claim 1, wherein while in an unprogrammed state, the at least one source region and the at least one drain region are separated by a distance comparable to a width of the gate in a direction between the at least one source region and the at least one drain region.

11. The antifuse of claim 1, wherein the antifuse is configured such that application of the programming current to the antifuse causes at least a portion of the body to reach a temperature greater than 700° C.

12. The antifuse of claim 1, wherein the antifuse is configured such that application of the programming current to the antifuse for a duration of less than 50 milliseconds causes at least a portion of the body to reach a temperature of greater than 700° C. and to cause the edge of the at least one first region to move sufficiently to produce the one or more order of magnitude reduction in resistance.

13. The antifuse of claim 1, wherein the body and the first regions are disposed in an active semiconductor device layer of a silicon-on-insulator ("SOI") substrate, the SOI substrate including a bulk semiconductor layer and a buried dielectric layer separating the active semiconductor device layer from the bulk semiconductor layer.

14. The antifuse of claim 1, wherein the body and the first regions are disposed in an active semiconductor device layer of a substrate overlying a bulk semiconductor layer of the substrate, the active semiconductor device layer including a stressed semiconductor alloy of silicon with a second semiconductor material, the stressed semiconductor alloy and the bulk semiconductor layer containing first and second different weight percentages of the second semiconductor material, respectively.

15. A method of programming an antifuse, comprising;
driving a programming current between at least one of a plurality of first regions of an insulated gate field effect transistor ("IGFET") and a body contact connected to a body of the IGFET, the first regions including at least one source region and at least one drain region, the body having a portion disposed between the at least one source region and the at least one drain region, in which the body and the plurality of first regions have first and second opposite conductivities selected from n-type and p-type conductivities, such that the programming current causes heating within the body sufficient to drive dopant diffusion from the at least one first region into the body such that an edge of the at least one first region moves closer to an adjacent edge of at least one other of the first regions, thus permanently reducing an electrical resistance between the at least one first region and the at least one other first region by one or more orders of magnitude; and
applying a programming voltage between the at least one first region and the body which is approximately equal to a nominal maximum voltage between the at least one first region and the gate useable to operate the IGFET in an on-state,
wherein application of the programming current to the antifuse causes heating within the body sufficient to move the edge of the first semiconductor region sufficiently to produce the one or more order of magnitude reduction in resistance without melting either the silicide region or the semiconductor material of the body.

16. The method of claim 15, wherein the first regions includes a source region and a drain region, and the programming current driven between the source region and the body contact and between the drain region and the body contact cause heating within the body sufficient to drive dopant diffusion from each of the source region and drain region into the body and cause edges of each of the source region and the drain region to move closer to one another.

17. The method of claim 15, wherein the step of driving the programming current causes the body to reach a temperature greater than 700° C.

18. The method of claim 15, wherein the step of driving the programming current is performed for a duration of less than 1000 milliseconds and causes the body to reach a temperature greater than 700° C.

* * * * *